US 6,636,312 B1

(12) United States Patent
Hsin et al.

(10) Patent No.: US 6,636,312 B1
(45) Date of Patent: Oct. 21, 2003

(54) MULTI-PITCH VERNIER FOR CHECKING ALIGNMENT ACCURACY

(75) Inventors: Chih-Hsing Hsin, Hsinchu Hsien (TW); Wen-Bin Shieh, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/520,821

(22) Filed: Mar. 8, 2000

(30) Foreign Application Priority Data

Mar. 1, 2000 (TW) .......................... 89103560 A

(51) Int. Cl.[7] .............................................. G01B 11/00
(52) U.S. Cl. .......................................... 356/401; 430/30
(58) Field of Search .................. 356/400, 401, 356/399; 430/22, 30

(56) References Cited

U.S. PATENT DOCUMENTS 5,508,803 A * 4/1996 Hibbs et al. .............. 356/243.5
5,952,134 A * 9/1999 Hwang ........................ 430/22

* cited by examiner

*Primary Examiner*—Zandra V. Smith
(74) *Attorney, Agent, or Firm*—J. C. Patents

(57) ABSTRACT

A vernier having multi-pitch for checking alignment accuracy. The vernier has the same pitch as the line width of the IC pattern where the diffraction angle of the vernier is the same as that of the IC pattern. The pitch comprises slits which cannot produce image on the wafer, such that a simultaneous pattern with the conventional pattern on the wafer is formed. Accordingly, the alignment accuracy can be accurately checked, thereby monitoring the alignment of IC patterns.

7 Claims, 3 Drawing Sheets

MULTI-PITCH VERNIER FOR CHECKING ALIGNMENT ACCURACY

CROSS-REFERENCE TO RELATED APPLICATION

This application claims the priority benefit of Taiwan application serial no. 89103560, filed Mar. 1, 2000.

BACKGROUND OF THE INVENTION

1. Field of Invention

The present invention relates to the fabrication of semiconductor integrated circuits (ICs). More particularly, the present invention relates to a vernier for checking alignment accuracy (AA).

2. Description of Related Art

The fabrication of integrated circuits is accomplished by using different masks to perform photolithography and etching steps. In each step of photolithography, the present photomask must be aligned with a pattern already defined on the wafer by a previous photolithography operation. The alignment accuracy between a present IC pattern and a previous IC pattern becomes more and more important as the scale of the integrated circuits is reduced. In order to check the alignment accuracy, it is usual to design a vernier within scribe lines. The alignment check pattern of the vernier can be, for example, box-box, as illustrated in FIG. 1, or the pattern of bar-bar 200, as shown in FIG. 200.

To check the alignment accuracy, the peripheral alignment check pattern 102, 202 of the vernier 100, 200 is first exposed on the scribe line when the previous IC pattern is formed. Thereafter, when forming the present IC pattern, the central alignment check pattern 104, 204 of the vernier 100, 200, as shown in FIG. 1 and FIG. 2, is exposed within the peripheral alignment check pattern 102, 202 on the wafer. Accordingly, the alignment accuracy is checked by the distances X1, X2, Y1, Y2 between the peripheral alignment check pattern 102, 202 and the central alignment check pattern 104, 204 exposed on the wafer.

The width of the peripheral alignment check pattern 102, 202 and the central alignment check pattern 104, 204 of the vernier 100, 200 is usually about 2 μm–4 μm. However, the line width of ICs has been developed to approach to or even less then 0.25 μm. In the photolithography of ICs, the line width of the photomask is equivalent to the slit that the exposure light passes. It is well known that the diffraction angle is in inverse proportion to the pitch of the slit $$\left(\theta \approx \frac{\lambda}{d},\right.$$

wherein θ is diffraction angle, λ is wavelength, and d is the pitch of the slit). Accordingly, the diffraction angle of the IC pattern is far larger than that of the alignment check pattern since the line width of the main pattern is less than that of the alignment check pattern. Such variance in diffraction angle causes difference of pattern distortion between the IC pattern and the alignment check pattern on the wafer when the exposure light passes the lens of the stepper. Therefore, the alignment accuracy checked by the alignment check pattern in this manner cannot accurately detect the alignment of the IC pattern.

SUMMARY OF THE INVENTION

The invention provides a multi-pitch vernier, thereby accurately checking the alignment accuracy of the IC patterns.

As embodied and broadly described herein, the invention provides a multi-pitch vernier including a plurality of pre-determined pattern elements with a constant pitch. The pitch, including a bright line and a dark line, equals to the design rule of the IC pattern. The width of the bright line can not be resolved by the exposure light. Accordingly, the multi-pitch vernier can check the alignment accuracy of the patterns formed by photolithography of IC.

This invention further provides a method of checking alignment accuracy using multi-pitch vernier. A peripheral alignment check pattern having multi-pitch is provided and a first pre-determined pattern of a peripheral alignment check pattern is formed. Thereafter, a second pre-determined pattern of a central alignment check pattern is formed using the central alignment check pattern. The distance between the peripheral and the central alignment check pattern is measured to check the alignment of the first and second pre-determined pattern. The peripheral and the central alignment check patterns comprise the patterns of box-box or bar-bar.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

To enable the vernier to accurately measure the alignment accuracy, this invention is to design a vernier where the vernier has the same pitch as the line width of the integrated circuit and comprises slits as to compose grating. The diffraction angles of the vernier and the IC pattern are the same when the pitch of the vernier is equivalent to the line width of the IC. The slits on the vernier do not produce image thereon so that the pattern of the vernier exposed on the wafer is the same as the conventional vernier. Accordingly, the alignment of the previous and present pattern can be accurately checked.

Figure 3A:
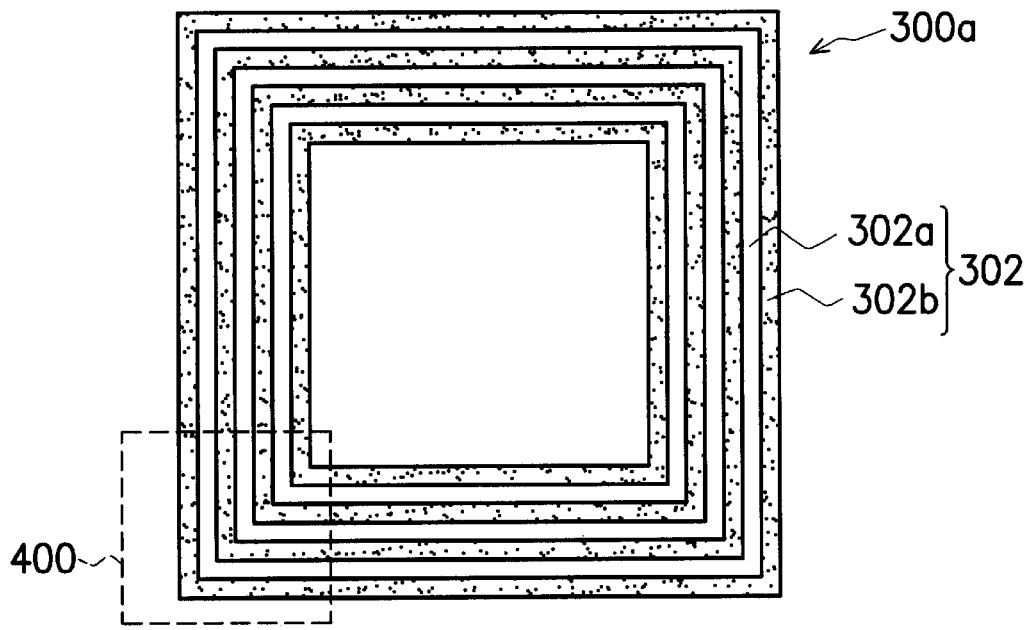
FIG. 3A and FIG. 3B are schematic view illustrating check alignment pattern with multi-pitch according to one preferred embodiment of this invention.
Figure 3B:
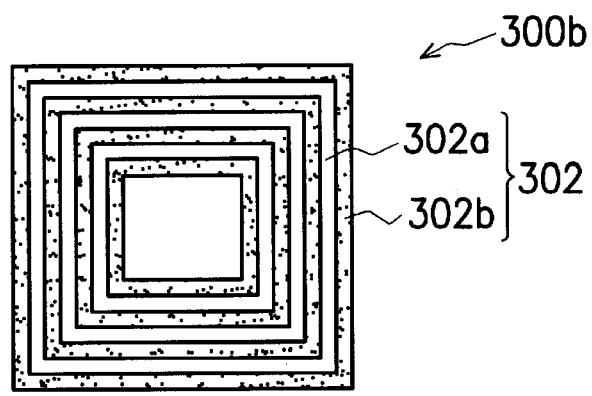
Figure 4:
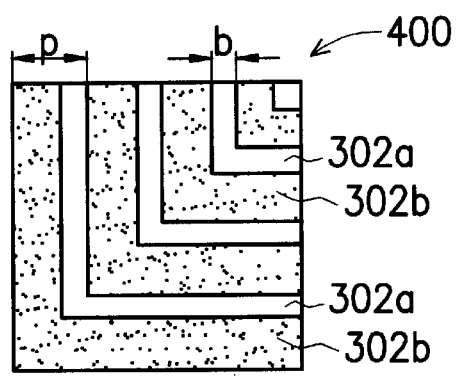
FIG. 4 is an enlarged figure of the dot-line portion of FIG. 3.
Figure 5A:
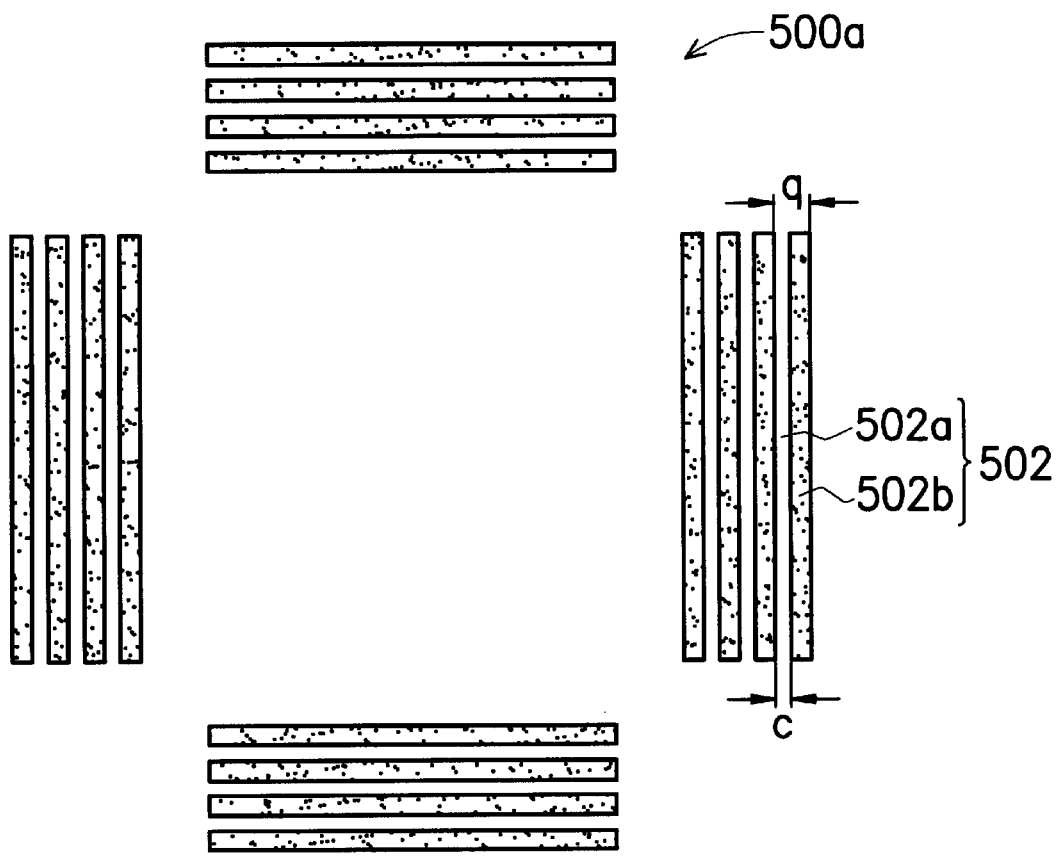
FIG. 5A and FIG. 5B are schematic view illustrating check alignment pattern with multi-pitch according to another preferred embodiment of this invention.
Figure 5B:
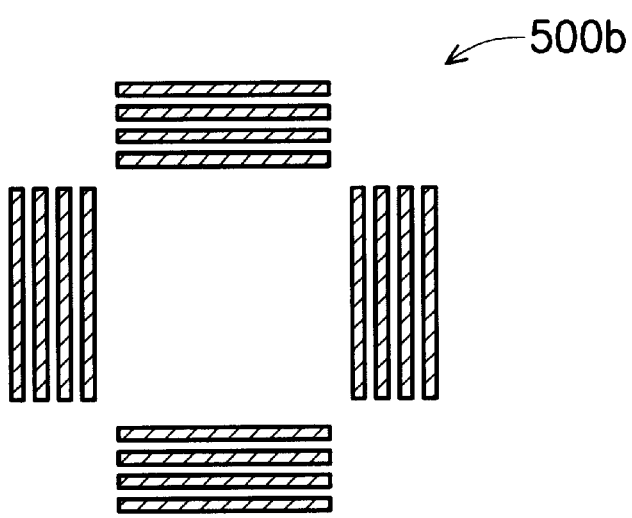

FIG. 3A and FIG. 3B are schematic view, respectively, of the peripheral and the central check alignment pattern with multi-pitch, and FIG. 4 is a enlarged figure of dot-line portion 400 of FIG. 3A. The design of the peripheral 300a and the central 300b check alignment patterns of the vernier comprises a pre-determined pattern of a plurality of pattern elements 302 having a constant pitch "p". The pre-determined pattern can be square loop band-shaped, as shown in FIGS. 3A and 3B, and the pattern elements 302 are parallel with each other.

Figure 1:
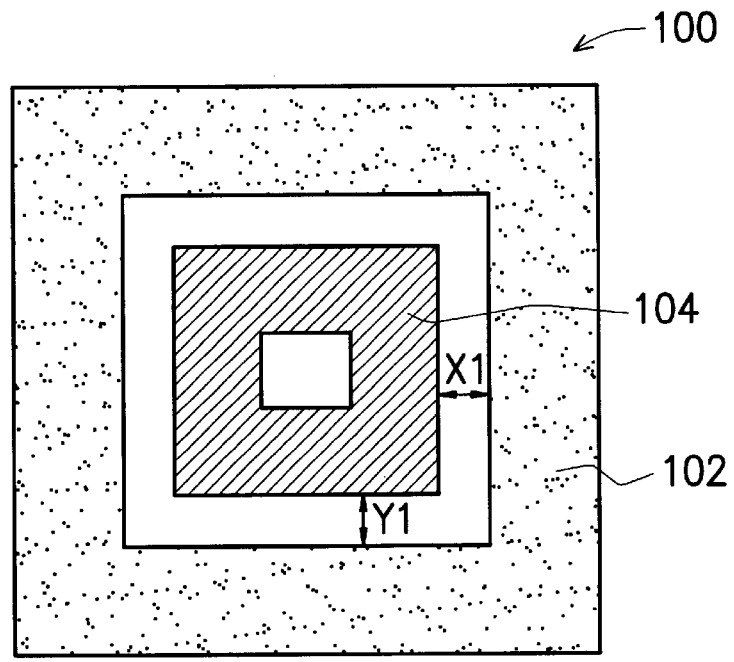
FIG. 1 is one of vernier for checking alignment accuracy of IC in prior art.
Figure 2:
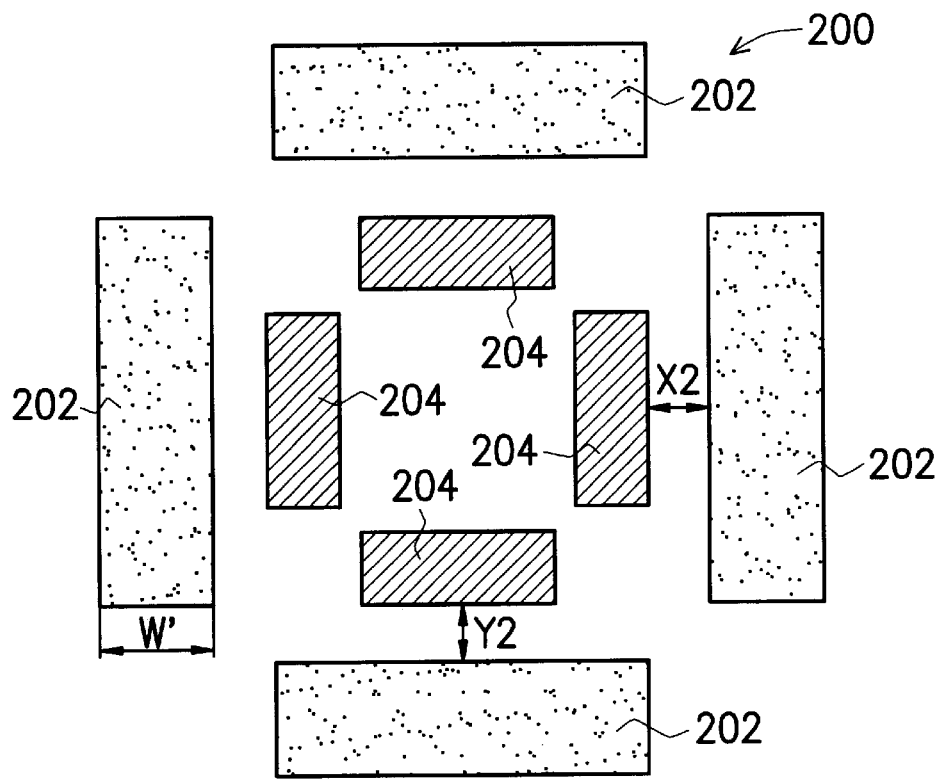
FIG. 2 is another vernier for checking alignment accuracy of IC in prior art.

The pitch "p", including a bright line 302a and a dark line 302b, needs to equal to the width of the design rule of the IC pattern where the bright line is a zone that the exposure light can penetrate. The width "b" of the bright line 302a is substantially narrow that the exposure light cannot resolve. Since the pitch "p" is equivalent to the line width of the IC pattern, the diffraction angle of the peripheral 300a and the central 300b check alignment pattern approaches that of the IC pattern. In another aspect, since the width of the bright line 302a is narrow enough to not be recognized such that the bright line 302a does not produce image on the wafer. Therefore, the peripheral 300a and the central 300b check alignment pattern being exposed on the wafer is as well as the peripheral 102 and the central pattern 104 as illustrated in FIG. 1. Measuring the difference X1, Y1 between the peripheral 102 and the central alignment check 104 pattern can accurately check the alignment of the IC patterns.

A first photomask, having the peripheral check alignment pattern 300a and a first IC pattern, is utilized to perform a step of exposure on the wafer. The pitch "p" of the peripheral check alignment pattern 300a has to equal to the design rule of the first IC pattern, and accordingly, the diffraction angle of the peripheral check alignment pattern 300a is the same with that of the first IC pattern. The aberration of the peripheral check alignment pattern 300a is simultaneous with that of the first IC pattern 300a. The width of the bright line 304a has to be designed in a range that the exposure light cannot resolve. Thus, the peripheral check alignment pattern 300a of the vernier, as well as the first IC pattern, is exposed on the wafer as the pattern of the peripheral check alignment pattern 102 of FIG. 1.

Deposition, cleaning or other required semiconductor process is performed on the first IC pattern, if necessary. When the photolithography is performed again on the first IC pattern or the materials above the first CI pattern, a mask having the central check alignment 300b in the preferred embodiment of the invention and a second IC pattern are utilized to perform a step of exposure. The pitch "p" of the central check alignment pattern 300b has to equal to the design rule of the second IC pattern, and accordingly, the diffraction angle of the central check alignment pattern 300b is the same with that of the second IC pattern. The aberration of the central check alignment pattern 300b is simultaneous with that of the second IC pattern 300a. The width of the bright line 304a has to be designed in a range that the exposure light cannot resolve. Thus, the peripheral check alignment pattern 300b of the vernier, as well as the first IC pattern, is exposed on the wafer as the pattern of the peripheral check alignment pattern 104 of FIG. 1.

After the central check alignment pattern 300b is formed on the wafer, the vernier is observed by a microscope to check the alignment accuracy. The pattern exposed on the wafer is as shown in FIG. 1, such that the alignment accuracy between the first IC pattern and the second IC pattern can be checked by the difference of X1, Y1.

In addition, the vernier with multi-pitch can be illustrated as the peripheral check alignment pattern 500a and the central alignment pattern 500b. The check alignment pattern comprises a pre-determined pattern of a plurality of pattern elements 502 having a constant pitch "q". The pattern elements 502 can be bar-shaped, for example, and parallel with each other.

The pitch "q", including a bright line 502a and a dark line 502b, needs to equal to the width of the design rule of the IC pattern where the bright line is a zone that the exposure light can penetrate. The width "c" of the bright line 502a is substantially narrow that the exposure light cannot resolve. Since the pitch "q" is equivalent to the line width of the IC pattern, the diffraction angle of the peripheral 500a and the central 500b check alignment pattern approaches that of the IC pattern. In another aspect, since the width of the bright line 502a is narrow enough to not be recognized such that the bright line 502a does not produce image on the wafer. Therefore, the peripheral 500a and the central 500b check alignment pattern being exposed on the wafer is as well as the peripheral 202 and the central pattern 204 as illustrated in FIG. 1. Measuring the difference X2, Y2 between the peripheral 202 and the central alignment check 204 pattern can accurately check the alignment of the IC patterns.

This preferred embodiment of the invention is to design such a vernier as grating that the pitch of the check alignment pattern of the vernier is the same as the line width of the IC pattern, thereby accurately reflecting the influence to the alignment accuracy due to the aberration of the lens. Therefore, the alignment accuracy of photolithography can be checked by such vernier.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A vernier with multi-pitch for checking alignment accuracy of a plurality of IC patterns fabricated by photolithography steps in semiconductor integrated circuits, the vernier comprising:

a plurality of pre-determined pattern elements having a constant pitch, the pitch equals to a line width of each IC pattern and comprises a bright line and a dark line wherein the width of the bright line is sufficiently narrow that the bright line does not produce an image on a wafer.

2. The vernier according to claim 1, wherein the pre-determined pattern element comprises square loop band-shaped.

3. The vernier according to claim 1, wherein the pre-determined pattern element comprises bar-bar shaped.

4. The vernier according to claim 1, wherein the pre-determined pattern elements are parallel with each other.

5. A method of checking the alignment accuracy of a mask pattern for a photolithography steps in fabricating semiconductor integrated circuits with a plurality of IC patterns where the IC patterns at least comprises a first and a second IC pattern; the method comprising:

provide a peripheral check alignment pattern having multi-pitch to form a first pre-determined pattern of the peripheral check alignment pattern on the first IC pattern, wherein the peripheral check alignment pattern comprises a plurality of elements, which are arranged in a pre-determined pattern with a first constant pitch, and the first pitch equals to a line width of the first pre-determined pattern and the first constant pitch comprises a bright line and a dark line where a width of the bright line is sufficiently narrow that the bright line does not produce an image on the wafer;

providing a central check alignment pattern having multi-pitch to form a second pre-determined pattern of the central check alignment pattern on the second IC pattern, wherein the central check alignment pattern comprises a plurality of elements, which are arranged in a pre-determined pattern with a second constant pitch, and the second pitch equals to a design rule of the second pre-determined pattern, and the second pitch equals to a line width of the second pre-determined pattern and the second constant pitch comprises a bright line and a dark line where a width of the bright line is sufficiently narrow that the bright line does not produce an image on the wafer; and measuring a distance between the first and the second pre-determined patterns to check the alignment accuracy.

6. The method according to claim 5, wherein the first pre-determined pattern and the second pre-determined pattern comprises box-box.

7. The method according to claim 5, wherein the first pre-determined pattern and the second pre-determined pattern comprises bar-bar.

* * * * *